United States Patent
Zhao et al.

(10) Patent No.: US 10,403,742 B2
(45) Date of Patent: Sep. 3, 2019

(54) FIELD-EFFECT TRANSISTORS WITH FINS FORMED BY A DAMASCENE-LIKE PROCESS

(71) Applicant: GLOBALFOUNDRIES Inc., Grand Cayman (KY)

(72) Inventors: Wei Zhao, Fort Lee, NJ (US); Haiting Wang, Clifton Park, NY (US); David P. Brunco, Latham, NY (US); Jiehui Shu, Clifton Park, NY (US); Shesh Mani Pandey, Saratoga Springs, NY (US); Jinping Liu, Ballston Lake, NY (US); Scott Beasor, Greenwich, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/712,748

(22) Filed: Sep. 22, 2017

(65) Prior Publication Data

US 2019/0097019 A1    Mar. 28, 2019

(51) Int. Cl.
| | |
|---|---|
| *H01L 29/66* | (2006.01) |
| *H01L 21/02* | (2006.01) |
| *H01L 21/762* | (2006.01) |
| *H01L 29/417* | (2006.01) |
| *H01L 21/8234* | (2006.01) |
| *H01L 21/8238* | (2006.01) |
| *H01L 27/088* | (2006.01) |
| *H01L 27/092* | (2006.01) |
| *H01L 29/10* | (2006.01) |

(Continued)

(52) U.S. Cl.
CPC .... *H01L 29/6681* (2013.01); *H01L 21/02532* (2013.01); *H01L 21/02636* (2013.01); *H01L 21/02664* (2013.01); *H01L 21/76224* (2013.01); *H01L 21/823431* (2013.01); *H01L 21/823821* (2013.01); *H01L 27/0886* (2013.01); *H01L 27/0924* (2013.01); *H01L 29/1054* (2013.01); *H01L 29/41791* (2013.01); *H01L 29/66795* (2013.01); *H01L 21/845* (2013.01); *H01L 27/1211* (2013.01)

(58) Field of Classification Search
CPC ......... H01L 21/823431; H01L 29/6681; H01L 29/02532
See application file for complete search history.

(56) References Cited

U.S. PATENT DOCUMENTS

| | | | |
|---|---|---|---|
| 6,835,618 B1 | 12/2004 | Dakshina-Murthy et al. | |
| 8,828,839 B2 | 9/2014 | Brunco et al. | |
| 9,324,868 B2 | 4/2016 | Yan et al. | |

(Continued)

*Primary Examiner* — Wael M Fahmy
*Assistant Examiner* — Sarah K Salerno
(74) *Attorney, Agent, or Firm* — Thompson Hine LLP; Francois Pagette (57) ABSTRACT

Methods of forming a structure for a fin-type field-effect transistor and structures for a fin-type field-effect transistor. An etch stop layer, a sacrificial layer, and a dielectric layer are arranged in a layer stack formed on a substrate. a plurality of openings are formed that extend through the layer stack to the substrate. A semiconductor material is epitaxially grown inside each of the plurality of openings from the substrate to form a plurality of fins embedded in the layer stack. The sacrificial layer is removed selective to the etch stop layer to reveal a section of each of the plurality of fins.

14 Claims, 7 Drawing Sheets

(51) Int. Cl.
*H01L 21/84* (2006.01)
*H01L 27/12* (2006.01)

(56) References Cited

U.S. PATENT DOCUMENTS

| | | |
|---|---|---|
| 9,437,504 B2 | 9/2016 | Loubet et al. |
| 9,595,599 B1 | 3/2017 | Bu et al. |
| 2009/0057780 A1* | 3/2009 | Wong .................... H01L 21/845 257/401 |
| 2013/0224936 A1* | 8/2013 | Lee ................. H01L 21/823431 438/492 |
| 2013/0313619 A1* | 11/2013 | Fumitake ............. H01L 21/845 257/288 |
| 2015/0024573 A1 | 1/2015 | Jacob et al. |
| 2015/0380258 A1* | 12/2015 | Liu ...................... H01L 29/785 257/192 |

* cited by examiner

FIG. 18

FIELD-EFFECT TRANSISTORS WITH FINS FORMED BY A DAMASCENE-LIKE PROCESS

BACKGROUND

The present invention relates to semiconductor device fabrication and integrated circuits and, more specifically, to methods of forming a structure for a fin-type field-effect transistor and structures for a fin-type field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

SUMMARY

In an embodiment, a method includes forming an etch stop layer, a sacrificial layer, and a dielectric layer arranged in a layer stack on a substrate. The method further includes forming a plurality of openings that extend through the layer stack to the substrate, and epitaxially growing a semiconductor material inside each of the plurality of openings from the substrate to form a plurality of fins embedded in the layer stack. The sacrificial layer is removed selective to the etch stop layer to reveal a section of each of the plurality of fins.

In an embodiment, a method includes forming a first dielectric layer and a second dielectric layer arranged in a layer stack on a substrate, forming a plurality of openings that extend through the layer stack to the substrate, and epitaxially growing a semiconductor material inside each of the plurality of openings to form a plurality of fins embedded in the layer stack. The first dielectric layer is removed selective to the second dielectric layer to reveal a section of each of the plurality of fins.

In an embodiment, a structure includes a layer stack on a substrate. The layer stack includes a first dielectric layer and a second dielectric layer arranged between the first dielectric layer and the substrate. The first dielectric layer is composed of a first material, and the second dielectric layer composed of a material with etch selectivity to the first material. The structure further includes a plurality of fins projecting from the substrate through the first dielectric layer and the second dielectric layer. Each of the plurality of fins has a section arranged above the top surface of the first dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
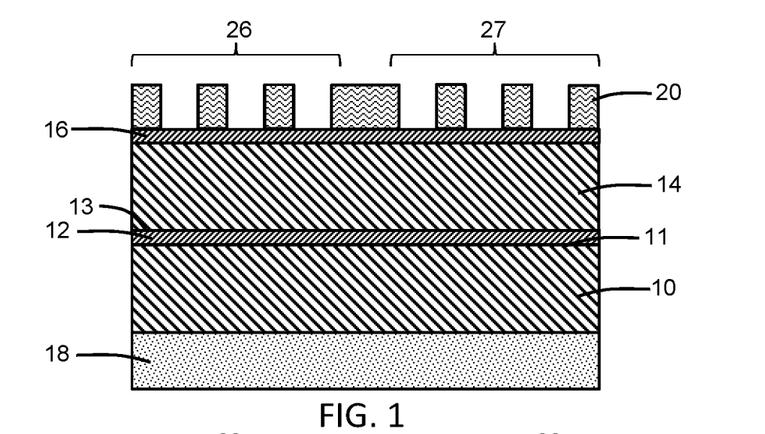
FIGS. 1-6 are cross-sectional views of a device structure at successive fabrication stages of a processing method in accordance with embodiments of the invention.

With reference to FIG. 1 and in accordance with embodiments of the invention, multiple dielectric layers 10, 12, 14, 16 are vertically arranged in a layer stack on a substrate 18. The dielectric layers 12 and 16 may be composed of one or more dielectric materials that are selected to etch selective to one or more dielectric materials of the dielectric layers 10 and 14. In an embodiment, the dielectric layers 10 and 14 may be composed of the same dielectric material, and the dielectric layers 12 and 16 may also be composed of the same dielectric material and may be thinner than dielectric layers 10 and 14. In an embodiment, the dielectric layer 10 may be composed of silicon dioxide ($SiO_2$) grown by oxidizing the substrate 18, the dielectric layer 14 may be composed of silicon dioxide ($SiO_2$) deposited by chemical vapor deposition (CVD), and the dielectric layers 12 and 16 may be composed of silicon nitride ($Si_3N_4$) deposited by CVD and that exhibits etch selectivity relative to silicon dioxide. The substrate 18 may be composed of single crystal semiconductor material, such as single crystal silicon, a III-V semiconductor material, or may be a semiconducting heterostructure like silicon-on-insulator or SiGe on Si.

A hardmask 20 is arranged on the top surface of dielectric layer 16, and may be composed of a material (or multiple layers of different materials) that etches selective to the materials of the dielectric layers 10, 12, 14, 16. The hardmask 20, which is image inversed, may be patterned using, for example, self-aligned double patterning (SADP), self-aligned quadruple patterning (SAQP), or EUV lithography, and includes a pattern that reflects the pattern of the fins to be subsequently formed. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 2:
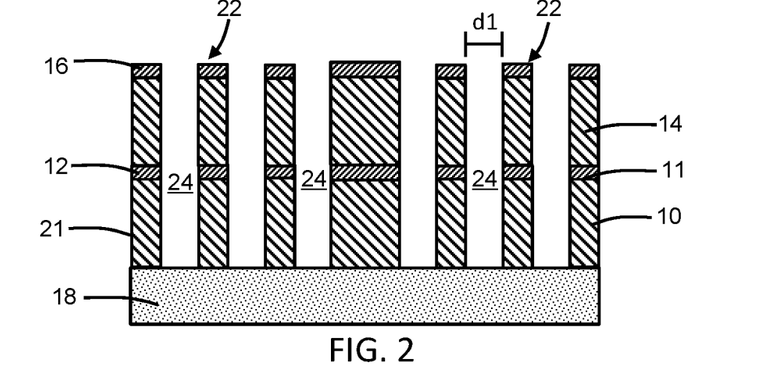

With reference to FIG. 2 in which like reference numerals refer to like features in FIG. 1 and at a subsequent fabrication stage, template structures 22 are patterned by etching the dielectric layers 10, 12, 14, 16 with an anisotropic etching process using the hardmask 20 as an etch mask. The anisotropic etching process, such as a reactive-ion etching (RIE), may be conducted in a single etching step or multiple etching steps with different etch chemistries. The etch chemistry for the anisotropic etching process that penetrates through the bottommost dielectric layer 10 is selected to stop on the material of the substrate 18 at its top surface.

Openings 24 of width dimension d1 are formed by the anisotropic etching process in the dielectric layers 10, 12, 14, 16 over areas not masked by the hardmask 20. The openings 24 are arranged between the vertical sidewalls 21 of adjacent pairs of the template structures 22 with the vertical sidewalls 21 separated by the width dimension of the openings 24. The verticality of the vertical sidewalls 21 arises from the anisotropic etching process used to form the openings 24. The hardmask 20 may be stripped after the formation of the template structures 22. Some of the openings 24 are formed in a region 26 of the layer stack and some of the openings 24 are formed in a region 27 of the layer stack, and an area of the layer stack is arranged between the region 26 and the region 27.

Figure 3:
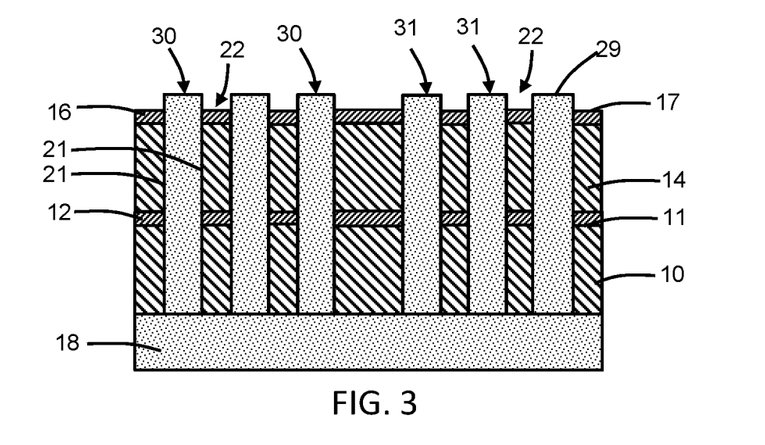

With reference to FIG. 3 in which like reference numerals refer to like features in FIG. 2 and at a subsequent fabrication stage, fins 30 composed of a semiconductor material are formed in the openings 24 between the template structures 22 in the region 26 (FIG. 1), and fins 31 composed of a semiconductor material are formed in the openings 24 between the template structures 22 in the region 27 (FIG. 1). The semiconductor material of the fins 30, 31 may be formed by an epitaxial growth process in which the single crystal semiconductor material of the substrate 18 serves as a growth seed for the epitaxial growth process. In an embodiment, the fins 30, 31 may be formed by a selective epitaxial growth (SEG) process in which semiconductor material nucleates for epitaxial growth on semiconductor surfaces (e.g., the substrate 18), but does not nucleate for epitaxial growth from insulator surfaces (e.g., the template structures 22). In an embodiment, the fins 30, 31 may be composed of single crystal silicon that has an epitaxial relationship with the substrate 18.

The epitaxial growth is constrained spatially by the openings 24, and the semiconductor material of each of the fins 30, 31 adopts the shape of the corresponding opening 24. The openings 24 may be overfilled by the semiconductor material such that an upper portion of the fins 30, 31 projects out of the openings 24 and above the top surface 17 of the dielectric layer 16. While FIG. 3 schematically shows the semiconductor material growing exclusively in a vertical direction above the top surface 17 of the dielectric layer 16, the semiconductor material may also grow laterally over top surface 17, resulting in a mushroom above each opening 24 or even a merged structure with overgrowth from adjacent openings 24 merging together.

Figure 4:
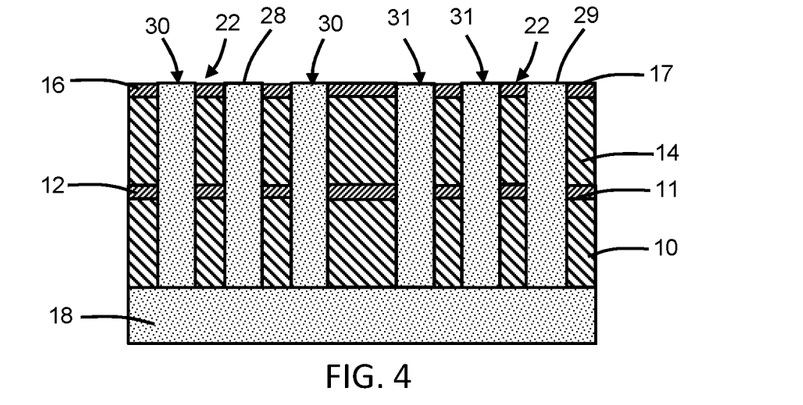

With reference to FIG. 4 in which like reference numerals refer to like features in FIG. 3 and at a subsequent fabrication stage, the fins 30, 31 are planarized following epitaxial growth relative to the dielectric layer 16 using a chemical-mechanical polishing (CMP) process. After polishing, a top surface 28 of each fin 30 and a top surface 29 of each fin 31 are coplanar with the top surface 17 of the dielectric layer 16. Dishing may occur during the polish that can result in the top surfaces 28, 29 and/or the top surface 17 being slightly uneven, which can be tolerated so long as the offset between the top surfaces 17, 28, 29 is approximately constant. A consequence of the planarization is that the fins 30 and the fins 31 all have the same height (i.e., equal heights) relative to the top surface 13 of the dielectric layer 12 and also to the top surface 11 of the dielectric layer 10 because the dielectric layer 16 functions as a polish stop layer.

Figure 5:
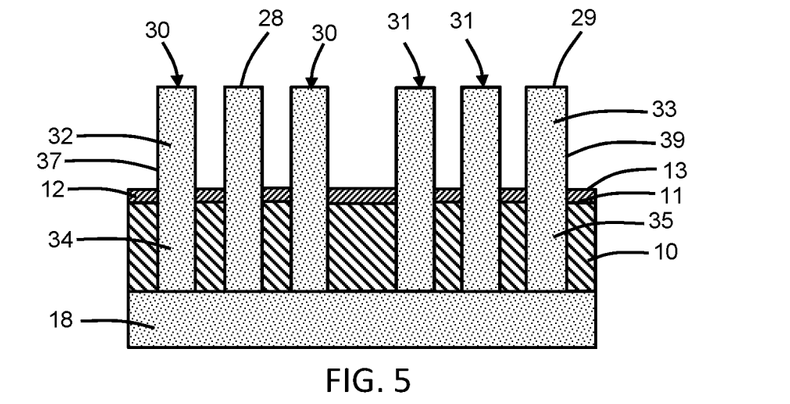

With reference to FIG. 5 in which like reference numerals refer to like features in FIG. 4 and at a subsequent fabrication stage, the dielectric layers 14, 16 of the template structures 22 represent sacrificial layers that are removed with an etching process. The etching process may be conducted in a single etching step or multiple etching steps with different etch chemistries selected to remove the dielectric layers 14, 16 of the template structures 22. The etch chemistry for the etching process that penetrates through the dielectric layer 14 is selected to stop on the material of the dielectric layer 12.

Sections 32 of the fins 30 and sections 33 of the fins 31, which are revealed by the etching process removing dielectric layers 14, 16, represent active regions (i.e., channel regions or source/drain region) of the fins 30, 31. The sections 32 of the fins 30 and the sections 33 of the fins 31 have equal heights relative to the top surface 13 of dielectric layer 12 and also relative to the top surface 11 of dielectric layer 10 because of the manner in which the dielectric layers 14, 16 of template structures 22 are removed relying on the dielectric layer 12 as an etch stop layer. In addition, due to the spatial constraint imposed by the openings 24 on the epitaxial growth, the sidewalls 37 of the fins 30 and the sidewalls 39 of the fins 31 are contained in planes oriented vertically relative to the top surface of the substrate 18. The sections 32 of fins 30 and the sections 33 of the fins 31 are arranged above the top surface 11 of the dielectric layer 10, and the sections 34 of fins 30 and the sections 35 of the fins 31 are arranged below the top surface 11 of the dielectric layer 10.

The sections 32 of the fins 30 and the sections 33 of the fins 31 may be trimmed or shaped by performing an optional trim etch, oxidation, and/or smoothing that narrows their width dimension and/or rounds sharp corners. The trim etch may include, for example, low ion energy plasma processing (e.g., using a Cl based chemistry). The oxidation may include, for example, oxidizing aqueous chemistries (e.g., ozonated water) or thermal processing in an oxidizing ambient (e.g., $O_2$, $O_3$, steam, oxygen radicals, or oxygen-containing ions). The smoothing process may include, for example, thermal processing in an environments that enhances the surface mobility of the semiconductor material (e.g., thermal anneals in low pressure $H_2$).

The dielectric layer 12 may be retained as a protect layer for the dielectric layer 10 in subsequent downstream processes and/or in the finished product. The dielectric layer 12 may be removed in part during subsequent processing either deliberately with an etching process or incidental to another processing step.

In an alternative embodiment, the dielectric layer 12 may be removed with an etching process after the dielectric layers 14, 16 are removed and before processing continues. If so, the sections 32 of fins 30 and the sections 33 of the fins 31 are arranged above the top surface 11 of the dielectric layer 10, and the sections 34 of fins 30 and the sections 35 of the fins 31 are arranged below the top surface 11 of the dielectric layer 10.

The dielectric layer 10, which is patterned before the fins 30, 31 are formed, provides high quality shallow trench isolation that eliminates concerns relating to complete filling and the formation of voids in the dielectric fill characteristic of conventional formation processes in which the dielectric material is deposited by CVD. The high quality of the dielectric layer 10, which may be formed by an oxidation process, eliminates the need for high temperature anneals to improve the quality of conventionally deposited dielectric fill used to form shallow trench isolation. Due to the elimination of the high temperature anneals, the fins 30, 31 are less susceptible to fin bending. The process flow is compatible with Si and SiGe channels in the revealed sections of the fins 30, 31. Due to the planarization of the fins 30, 31 relative to a top surface of an etch stop layer, the process provides excellent control over fin height, and may permit the formation of fins 30, 31 with dual fin heights. The constraint provided by the sidewalls 21 of the template structures 22 provides for a vertical fin profile characterized by vertical and planar sidewalls 37, 39, respectively, for the fins 30, 31.

Figure 6:
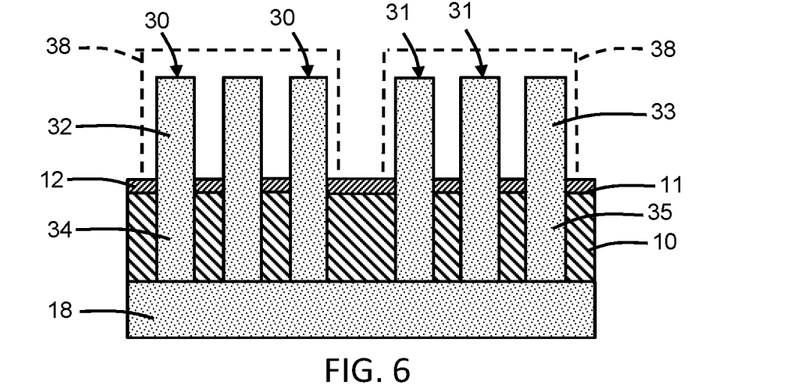

With reference to FIG. 6 in which like reference numerals refer to like features in FIG. 5 and at a subsequent fabrication stage, gate structures, as diagrammatically indicated by the dashed lines and reference numeral 38, of one or more field-effect transistors may be formed that overlap with a channel region in each of the fins 30 and that overlap with a channel region in each of the fins 31. Source and drain regions (not shown) may be formed in and/or on portions of the fins 30, 31 that flank the gate structures 38. The gate structures 38 may be formed as part of a replacement metal gate process. Each of the gate structures 38 may include a gate electrode and a gate dielectric interposed between the gate electrode and each channel region. The gate electrode may include one or more barrier metal layers, work function metal layers, and/or fill metal layers composed of conductors, such as metals (e.g., tungsten (W)) and/or metal nitrides or carbides (e.g., titanium nitride (TiN) and titanium aluminum carbide (TiAlC)). The gate dielectric may be composed of a dielectric material, such as a high-k dielectric material like hafnium oxide ($HfO_2$). The source and drain regions of the fins 30, 31 may be doped with a dopant, such as a Group V dopant like arsenic (As) or phosphorous (P) for n-type conductivity or a Group III dopant like boron (B) for p-type conductivity, that is diffused from heavily-doped semiconductor material that is grown from the source and drain regions.

The fins 30, 31 may be used to construct n-type field-effect transistors, p-type field-effect transistors, or a CMOS device (e.g., fins 30 are used to construct an n-type field-effect transistor and fins 31 are used to construct a p-type field-effect transistor). Sections 34 of the fins 30 and sections 35 of the fins 31 are embedded in the dielectric layer 10, which furnishes trench isolation. The trench isolation is formed in the processing sequence before the fins 30, 31 are formed.

Middle-of-line (MOL) processing and back-end-of-line (BEOL) processing follow, which includes formation of contacts, via plugs, and wiring of an interconnect structure connected with the field-effect transistor.

Figure 7:
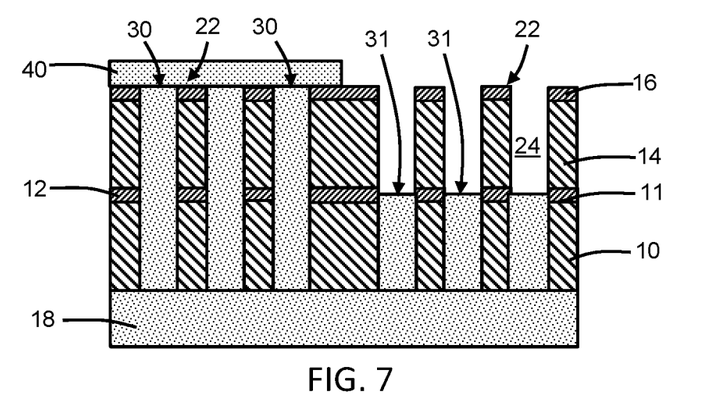
FIGS. 7-9 are cross-sectional views of a structure at successive fabrication stages subsequent to FIG. 4 of a processing method in accordance with alternative embodiments of the invention.

With reference to FIG. 7 in which like reference numerals refer to like features in FIG. 4 and at a subsequent fabrication stage in accordance with alternative embodiments, a hardmask 40 may be formed that covers the fins 30 while the fins 31 are exposed. An etching process may be used to partially remove an upper section of each fin 31 that is exposed by the hardmask 40 such that the openings 24 are partially re-opened. In an embodiment, the fins 31 may be recessed to a depth that is at or below the dielectric layer 12.

Figure 8:
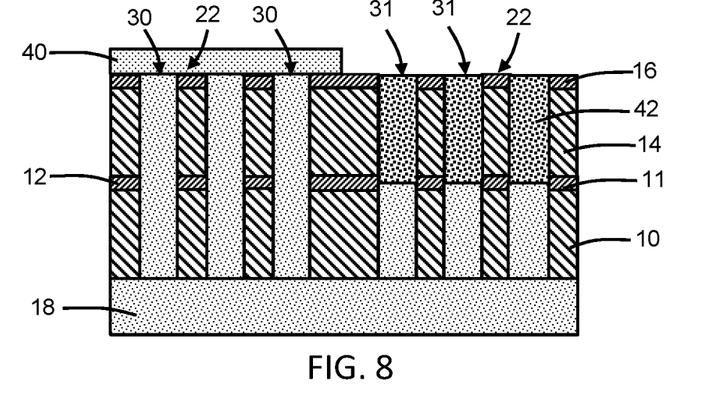

With reference to FIG. 8 in which like reference numerals refer to like features in FIG. 7 and at a subsequent fabrication stage, sections 42 of a semiconductor material are formed between the template structures 22 that replace the removed upper sections of the fins 31 and refill the openings 24. An epitaxial growth process may be used to deposit the epitaxial semiconductor material to form the sections 42. In an embodiment, the sections 42 may be formed by a selective epitaxial growth process in which semiconductor material nucleates for epitaxial growth on semiconductor surfaces, but does not nucleate for epitaxial growth from insulator surfaces. The epitaxial semiconductor material may be composed of silicon germanium (SiGe), which may be used to form a p-type field-effect transistor, or carbon-doped silicon (Si:C), which may be used to form an n-type field-effect transistor. In an alternative embodiment, the epitaxial semiconductor material may be composed of germanium (Ge).

Figure 9:
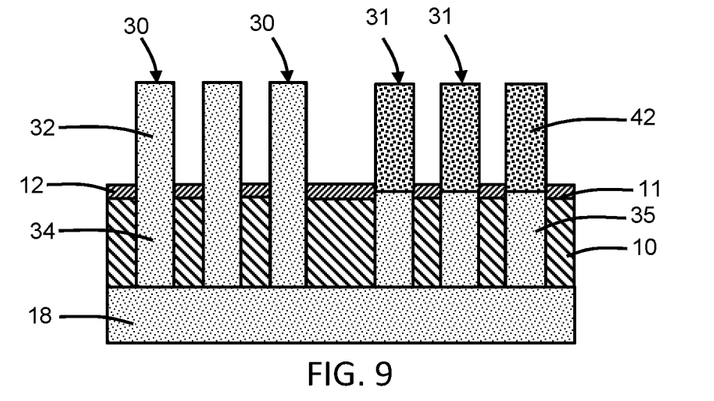

With reference to FIG. 9 in which like reference numerals refer to like features in FIG. 8 and at a subsequent fabrication stage, the hardmask 40 may be removed, and the sacrificial layers represented by dielectric layers 14, 16 may be removed as described in the context of FIG. 4. Processing may continue as described in the context of FIG. 6. After the removal of the hardmask 40, a CMP process may be used to remove any semiconductor material associated with the sections 42 that overfill the openings 24.

Figure 10:
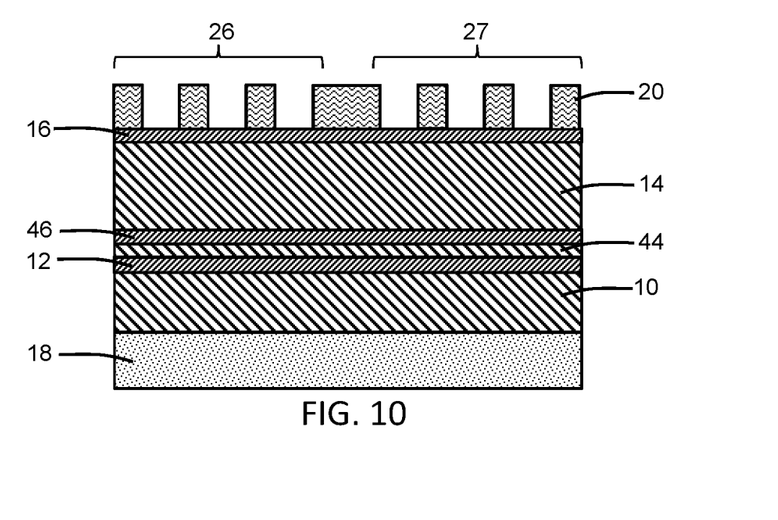
FIGS. 10-12 are cross-sectional views of a structure at successive fabrication stages of a processing method in accordance with alternative embodiments of the invention.

With reference to FIG. 10 in which like reference numerals refer to like features in FIG. 1 and in accordance with alternative embodiments, the layer stack that includes the dielectric layers 10, 12, 14, 16 may be modified to include additional dielectric layers 44, 46. The dielectric layer 46 may be composed of a dielectric material selected to etch selective to the dielectric materials of the adjacent dielectric layers 14 and 44. In an embodiment, the dielectric layer 44 may be composed of silicon dioxide ($SiO_2$) deposited by CVD, and the dielectric layer 46 may be composed of silicon nitride ($Si_3N_4$) deposited by CVD and that exhibits etch selectivity relative to silicon dioxide.

Figure 11:
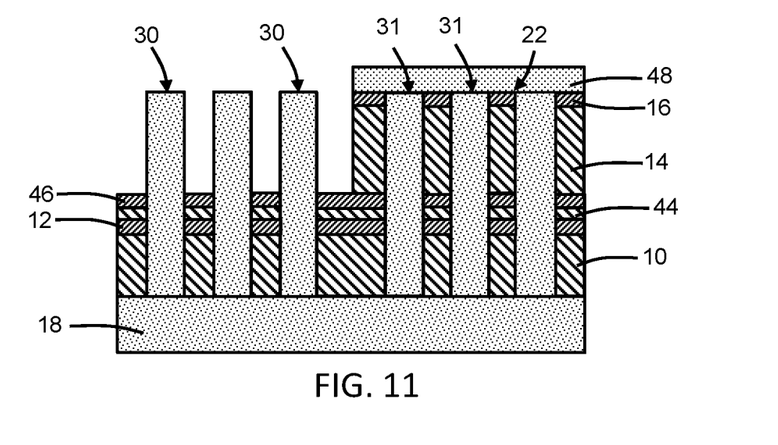

With reference to FIG. 11 in which like reference numerals refer to like features in FIG. 10 and at a subsequent fabrication stage, the template structures 22 are formed as described in the context of FIG. 2 and the fins 30, 31 are formed in the openings 24 between the template structures 22 as described in the context of FIG. 3. A hardmask 48 may be formed that covers some of the template structures 22 and fins 31 while other of the template structures 22 and fins 30 are exposed. The dielectric layers 14, 16 of the template structures 22 associated with fins 30 and exposed by the hardmask 48 are removed with an etching process. The etching process may be conducted in a single etching step or multiple etching steps with different etch chemistries selected to remove the dielectric layers 14, 16 of the template structures 22. The etch chemistry for the etching process that penetrates through the dielectric layer 14 is selected to stop on the material of the dielectric layer 46.

Figure 12:
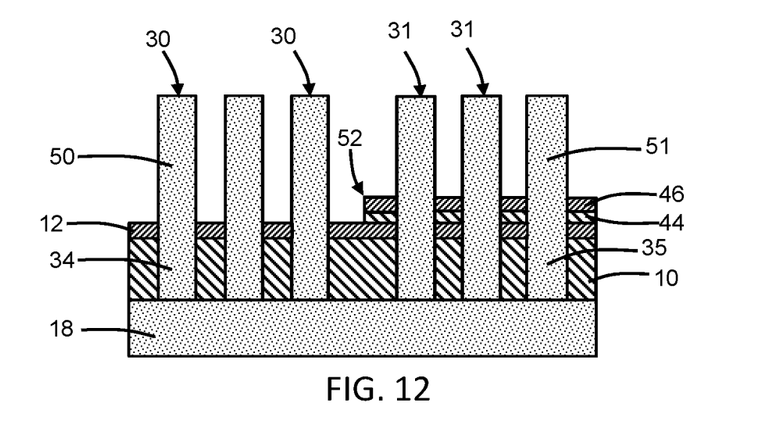

With reference to FIG. 12 in which like reference numerals refer to like features in FIG. 11 and at a subsequent fabrication stage, the hardmask 48 may be removed, and the dielectric layers 14, 16 of the template structures 22 associated with fins 31 are removed with an anisotropic etching process stopping on the dielectric layer 46. Concurrently, the anisotropic etching process removes the dielectric layers 44, 46 of the template structures 22 associated with fins 30 stopping on the dielectric layer 12. The etching process may be conducted in a single etching step or multiple etching steps with different etch chemistries. The dielectric layers 12 and 46 are selected to have the same or similar etch selectivity to the concluding etch chemistry so that each provides an independent etch stop layer.

Sections 50 of the fins 30 are revealed above the dielectric layer 12 by the anisotropic etching process, and represent active regions (i.e., channel regions) of the fins 30. Sections 51 of the fins 31 are revealed above the level of dielectric layer 46 by the anisotropic etching process, and represent active regions (e.g., channel regions or source/drain region) of the fins 31. The sections 50 of the fins 30 have equal heights relative to the top surface 13 of dielectric layer 12 because of the manner in which the dielectric layers 44, 46 of template structures 22 are removed relying on the dielectric layer 12 as an etch stop layer. The sections 51 of the fins 31 have equal heights relative to the top surface of dielectric layer 46 because of the manner in which the dielectric layers 14, 16 of template structures 22 are removed relying on the dielectric layer 46 as an etch stop layer. The sections 50 of the fins 30 have a fin height that is greater than the fin height of the sections 51 of the fins 31. Sections 34 of the fins 30 are embedded in dielectric layers 10, 12, and sections 35 of the fins 31 are embedded in dielectric layers 10, 12, 44, 46.

The dielectric layers 44, 46 provide a step 52 relative to a top surface 13 of the dielectric layer 12 at the transition in the area between the region 26 containing fins 30 and the region 27 containing fins 31. The step 52 transitions from the dielectric layer 46 associated with fins 31 to the dielectric layer 12 associated with fins 30. The height change introduced by the step is equal to the sum of the thickness of dielectric layer 44 and the thickness of dielectric layer 46. In embodiments in which the dielectric layer 46 is removed in the area containing fins 31 and the dielectric layer 12 is concurrently removed in the region 26 containing fins 30, the step 52 will persist and transition with this modification to the layering from dielectric layer 44 to dielectric layer 10. In this instance, the height change introduced by the step is equal to the sum of the thickness of dielectric layer 44 and the thickness of dielectric layer 12.

Processing may continue as described in the context of FIG. 6. In the final device structure of the field-effect transistor, the step 52 will persist, as well the presence of the dielectric layer 12 in the region 26 containing fins 30 and dielectric layers 12, 44, 46 in the region 27 containing fins 31. If the dielectric layer 46 is removed in the area containing fins 31 and the dielectric layer 12 is concurrently removed in the area containing fins 30, the step 52 will continue to persist, as well as the dielectric layers 12, 44 in the region 27 containing fins 31.

Figure 13:
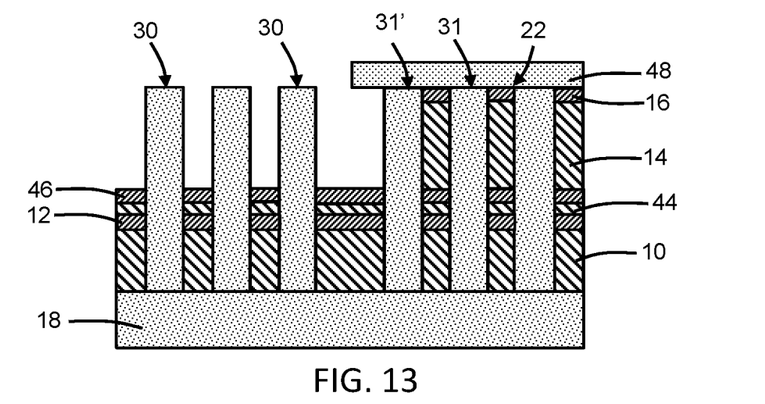
FIGS. 13 and 14 are cross-sectional views of a structure at successive fabrication stages of a processing method in accordance with alternative embodiments of the invention.

With reference to FIG. 13 in which like reference numerals refer to like features in FIG. 11 and in accordance with alternative embodiments, an isotropic etching process may be used to completely remove the dielectric layers 14, 16 in the area between region 26 and region 27 by undercutting the hardmask 48 such that a single dummy fin 31' is arranged at the edge of the area containing fins 31. The step 52 (FIG. 12) is eliminated by the change to the characteristics of the etching process. Nevertheless, aside from the dummy fin 31', the revealed active regions 50 of the fins 30 are taller than the revealed active regions 51 of the fins 31.

Figure 14:
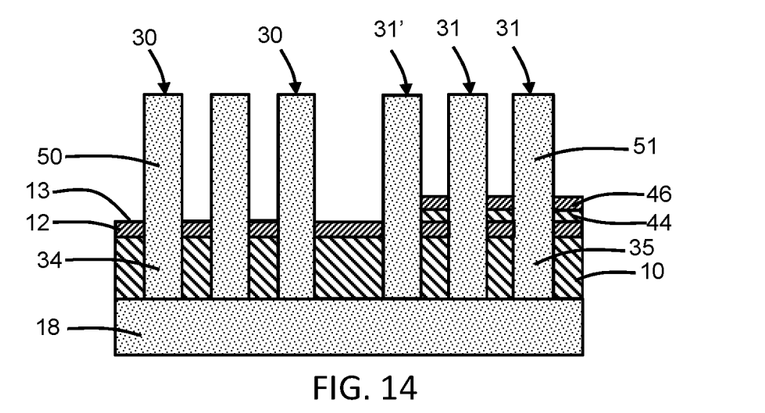

With reference to FIG. 14 in which like reference numerals refer to like features in FIG. 13 and at a subsequent fabrication stage, processing continues as described in the context of FIG. 12 to form the fins 31 and the fins 30 that have a fin height that is greater than the fin height of fins 31. The single dummy fin 31', which is arranged at the edge of the area containing fins 31, provides a transition between the shorter fins 31 and the taller fins 30, and may improve the robustness of the structure at the transition from the shorter fins 31 to the taller fins 30.

Figure 15:
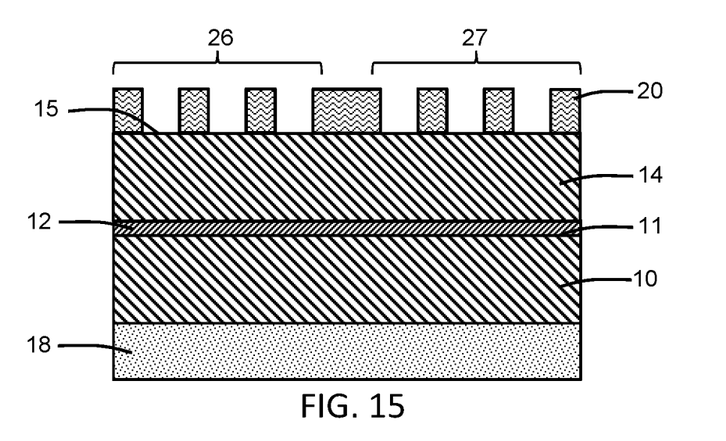
FIG. 15 is a cross-sectional view similar to FIG. 1 of a layer stack constructed in accordance with an alternative embodiment of the invention.

With reference to FIG. 15 in which like reference numerals refer to like features in FIG. 1 and in accordance with alternative embodiments, the initial layer stack may be modified to omit the dielectric layer 16. The process flow proceeds as described in FIGS. 2-6 with the dielectric layer 14 functioning as a polish stop layer when the semiconductor material grown in the openings 24 is planarized by CMP to be coplanar with the top surface 13 of the dielectric layer 14, and the dielectric layer 14 being removed as a sacrificial layer when the fins 30, 31 are revealed. The dielectric layer 12 still functions as a stop layer at its top surface 13 during the fabrication stage in which the fins 30, 31 are revealed, as specifically described in the context of FIG. 4.

Figure 16:
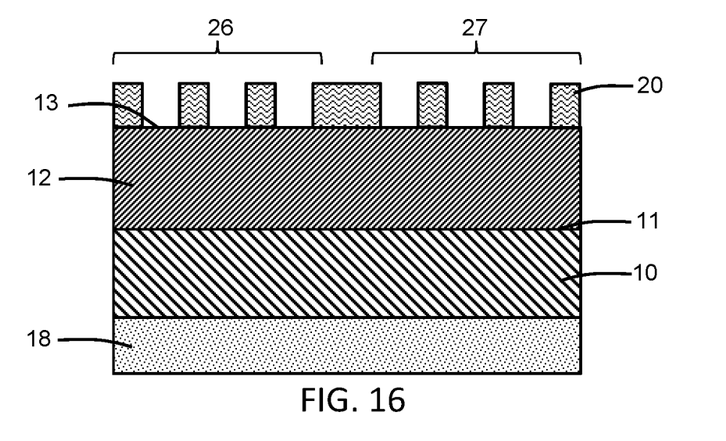
FIGS. 16-18 are cross-sectional views of a structure at successive fabrication stages of a processing method in accordance with alternative embodiments of the invention.

With reference to FIG. 16 in which like reference numerals refer to like features in FIG. 1 and in accordance with alternative embodiments, the initial layer stack may be modified to omit the dielectric layer 14 and the dielectric layer 16 from its construction. The dielectric layer 12 may be thickened to compensate for the elimination of dielectric layers 14, 16.

Figure 17:
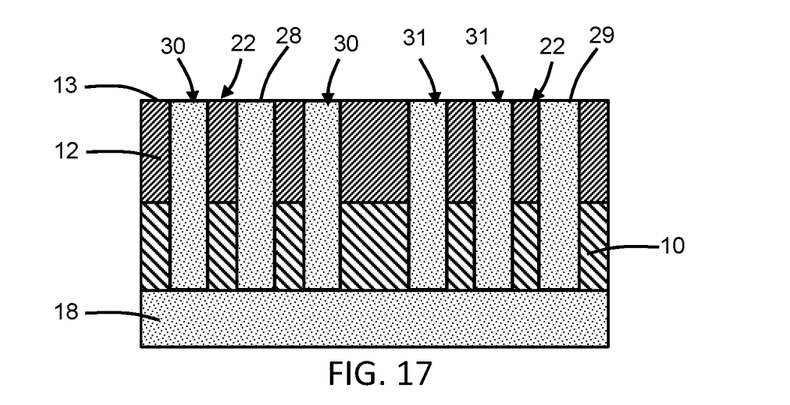

With reference to FIG. 17 in which like reference numerals refer to like features in FIG. 16 and at a subsequent fabrication stage, the openings 24 (FIG. 2) are formed that penetrate through the dielectric layers 10, 12 to the top surface of the substrate 18, and the fins 30, 31 are epitaxially grown and planarized by CMP as described in the context of FIGS. 3 and 4. The dielectric layer 12 functions as a polish stop layer when the semiconductor material is planarized to render the respective top surfaces 28, 29 of the fins 30, 31 coplanar with the top surface 13 of the dielectric layer 12.

Figure 18:
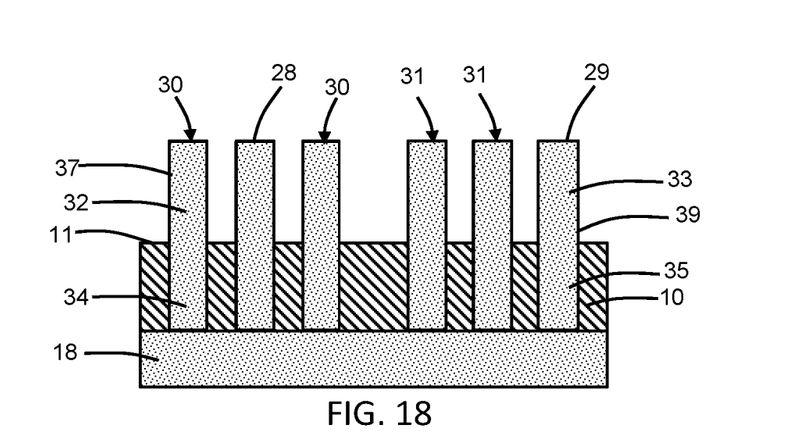

With reference to FIG. 18 in which like reference numerals refer to like features in FIG. 16 and at a subsequent fabrication stage, the dielectric layer 12 is removed by an etching process as a sacrificial layer to reveal the sections 32 of fins 30 and the sections 33 of fins 31. The dielectric layer 10 functions as an etch stop layer during the fabrication stage in which the fins 30, 31 are revealed. The sections 32 of fins 30 and the sections 33 of fins 31 have equal heights relative to the top surface 11 of dielectric layer 10 after dielectric layer 12 is removed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a polish stop layer, a first dielectric layer, a first etch stop layer, a second etch stop layer, and a first sacrificial layer arranged in a layer stack on a substrate with the first sacrificial layer arranged between the polish stop layer and the first etch stop layer and with the second etch stop layer arranged between the first etch stop layer and the first dielectric layer;
   forming a first plurality of openings in a first region of the layer stack and a second plurality of openings in a second region of the layer stack that each extend completely through the layer stack to the substrate;
   forming a first plurality of fins inside the first plurality of openings and a second plurality of fins inside the second plurality of openings with an epitaxial growth process;
   masking the second region of the layer stack and the second plurality of fins with a hardmask;
   removing the polish stop layer and the first sacrificial layer selective to the first etch stop layer in the first region of the layer stack, with the second region of the layer stack masked with the hardmask, to reveal a section of each of the first plurality of fins;
   after removing the polish stop layer and the first sacrificial layer selective to the first etch stop layer in the first region of the layer stack, removing the hardmask; and
   after removing the hardmask, concurrently removing the polish stop layer from the second region of the layer stack to reveal a section of each of the second plurality of fins and the first etch stop layer from the first region of the layer stack to further reveal the section of each of the first plurality of fins.

2. The method of claim 1 wherein forming the first plurality of fins inside the first plurality of openings and the second plurality of fins inside the second plurality of openings with the epitaxial growth process comprises:
   planarizing the first plurality of fins and the second plurality of fins relative to a top surface of the polish stop layer.

3. The method of claim 1 further comprising:
   forming a first gate structure that overlaps with the first plurality of fins and the second etch stop layer; and
   forming a second gate structure that overlaps with the second plurality of fins and the first etch stop layer.

4. The method of claim 1 wherein the first plurality of fins are comprised of a first semiconductor material, and further comprising:
   before the first sacrificial layer is removed, etching back the first plurality of fins inside the first plurality of openings; and
   growing a second semiconductor material inside each of the first plurality of openings such that the section of each of the first plurality of fins is comprised of the second semiconductor material.

5. The method of claim 4 wherein the first semiconductor material is silicon, and the second semiconductor material is silicon germanium or germanium.

6. The method of claim 1 further comprising:
   after concurrently removing the polish stop layer from the second region of the layer stack and the first etch stop layer from the first region of the layer stack, removing the first sacrificial layer selective to the first etch stop layer in the second region of the layer stack to further reveal the section of each of the second plurality of fins in the second region of the layer stack.

7. The method of claim 6 wherein the first sacrificial layer is removed from the second region of the layer stack with an isotropic etching process such that the first sacrificial layer is completely removed from an area between the first plurality of fins in the first region of the layer stack and the second plurality of fins in the second region of the layer stack.

8. The method of claim 6 wherein the first sacrificial layer is removed from the second region of the layer stack with an anisotropic etch process such that a section of the first sacrificial layer is retained in an area between the first plurality of fins in the first region of the layer stack and the second plurality of fins in the second region of the layer stack.

9. The method of claim 6 wherein the layer stack is further provided with a second dielectric layer between the first etch stop layer and the second etch stop layer, and further comprising:
   removing the second dielectric layer selective to the second etch stop layer in the first region of the layer stack concurrently with removing the first sacrificial layer from the second region of the layer stack.

10. The method of claim 9 wherein the section of each of the first plurality of fins has a first height relative to the first etch stop layer, the section of each of the second plurality of fins has a second height relative to the second etch stop layer, and the first height is greater than the second height.

11. The method of claim 6 wherein a step is defined as a height change at a transition from the first region of the layer stack to the second region of the layer stack after removing the first sacrificial layer selective to the first etch stop layer in the second region of the layer stack.

12. The method of claim 9 further comprising:
   after removing the second dielectric layer selective to the second etch stop layer in the first region of the layer stack, concurrently removing the second etch stop layer from the first region of the layer stack and the first etch stop layer from the second region of the layer stack.

13. The method of claim 1 wherein the first dielectric layer is provided by thermally oxidizing the substrate.

14. The method of claim 1 wherein the polish stop layer, the first etch stop layer, and the second etch stop layer are comprised of silicon nitride, and the first sacrificial layer and the first dielectric layer are comprised of silicon dioxide.

\* \* \* \* \*